United States Patent
Elsayed et al.

(10) Patent No.: US 10,788,376 B2
(45) Date of Patent: Sep. 29, 2020

(54) APPARATUS FOR SENSING TEMPERATURE IN ELECTRONIC CIRCUITRY AND ASSOCIATED METHODS

(71) Applicant: Silicon Laboratories Inc., Austin, TX (US)

(72) Inventors: Mohamed M. Elsayed, Austin, TX (US); Kenneth W. Fernald, Cedar Park, TX (US)

(73) Assignee: Silicon Laboratories Inc., Austin, TX (US)

( * ) Notice: Subject to any disclaimer, the term of this patent is extended or adjusted under 35 U.S.C. 154(b) by 96 days.

(21) Appl. No.: 15/717,924

(22) Filed: Sep. 27, 2017

(65) Prior Publication Data
US 2019/0094079 A1 Mar. 28, 2019

(51) Int. Cl.
| | | |
|---|---|---|
| *G01K 7/02* | (2006.01) | |
| *G05F 1/56* | (2006.01) | |
| *H03K 5/24* | (2006.01) | |
| *G05F 3/30* | (2006.01) | |
| *G01K 7/01* | (2006.01) | |

(52) U.S. Cl.
CPC .............. *G01K 7/02* (2013.01); *G01K 7/01* (2013.01); *G05F 1/56* (2013.01); *G05F 3/30* (2013.01); *H03K 5/24* (2013.01); *G01K 2219/00* (2013.01)

(58) Field of Classification Search
CPC ... G01K 7/00; G01K 7/01; G01K 7/02; G05F 1/56; H03K 5/24
See application file for complete search history.

(56) References Cited

U.S. PATENT DOCUMENTS

| | | | | | |
|---|---|---|---|---|---|
| 5,440,305 | A | * | 8/1995 | Signore | G01K 7/01 341/120 |
| 5,619,430 | A | * | 4/1997 | Nolan | G05D 23/1917 702/63 |
| 6,008,685 | A | * | 12/1999 | Kunst | G01K 7/01 327/512 |
| 6,078,208 | A | * | 6/2000 | Nolan | G01K 7/01 327/512 |

(Continued)

OTHER PUBLICATIONS

Pertijs, "A CMOS Smart Temperature Sensor with a 3σ Inaccuracy of ±0.1°C. from −55°C. to 125°C.," IEEE J. of Solid-State Circuits, vol. 40, No. 12, Dec. 2005, pp. 2805-2815.

(Continued)

*Primary Examiner* — Nathaniel T Woodward
*Assistant Examiner* — Philip L Cotey
(74) *Attorney, Agent, or Firm* — Law Offices of Maximilian R. Peterson

(57) ABSTRACT

An apparatus includes a temperature measurement circuit. The temperature measurement circuit includes a bandgap circuit including an amplifier having an offset voltage that is compensated by using a set of trimming bits. The bandgap circuit provides first and second voltages related to a temperature to be measured. The temperature measurement circuit further includes a measuring circuit coupled to receive the first and second voltages. The measuring circuit further includes a comparator coupled to receive the first and second voltages, wherein the measuring circuit derives a temperature measurement from the first and second voltages.

20 Claims, 13 Drawing Sheets

(56) References Cited

U.S. PATENT DOCUMENTS

| | | | | |
|---|---|---|---|---|
| 7,448,797 B2* | 11/2008 | Horn | .................. | G01K 7/015 327/512 |
| 7,524,107 B1* | 4/2009 | Lorenz | .................. | G01K 3/005 324/417 |
| 8,303,178 B2 | 11/2012 | Yi | | |
| 9,046,910 B2* | 6/2015 | Sako | .................. | G05F 3/10 |
| 9,715,913 B1* | 7/2017 | Yin | .................. | G11C 7/04 |
| 9,891,116 B2* | 2/2018 | Obayashi | .................. | G01K 7/01 |
| 2001/0045470 A1 | 11/2001 | Poucher | | |
| 2004/0070495 A1* | 4/2004 | Chu | .................. | G01D 18/008 340/501 |
| 2008/0082291 A1* | 4/2008 | Jeong | .................. | G01K 7/015 702/136 |
| 2008/0095213 A1* | 4/2008 | Lin | .................. | G01K 7/015 374/170 |
| 2009/0066313 A1 | 3/2009 | Kimura | | |
| 2009/0201067 A1 | 8/2009 | Haneda | | |
| 2010/0156519 A1* | 6/2010 | Cremonesi | .................. | G05F 1/46 327/539 |
| 2010/0237955 A1* | 9/2010 | Mahooti | .................. | H03K 3/0231 331/66 |
| 2016/0238464 A1* | 8/2016 | Eberlein | .................. | G01K 7/01 |
| 2016/0266598 A1* | 9/2016 | Wong | .................. | G05F 3/30 |
| 2017/0063223 A1* | 3/2017 | Raghupathy | .................. | G05F 1/56 |
| 2017/0227409 A1* | 8/2017 | Wadhwa | .................. | G01K 13/00 |
| 2017/0257113 A1* | 9/2017 | Singh | .................. | G05F 3/245 |

OTHER PUBLICATIONS

Pertijs, "Precision Temperature Sensors in CMOS Technology" (2006), 306 pgs. (Note: Reference has been divided into 3 files (C2_1.pdf, C2_2.pdf, and C2_3.pdf) to meet the PTO file-size limits.).

* cited by examiner

APPARATUS FOR SENSING TEMPERATURE IN ELECTRONIC CIRCUITRY AND ASSOCIATED METHODS

TECHNICAL FIELD

The disclosure relates generally to temperature measuring and, more particularly, to apparatus for electronic sensing or measurement of temperature with improved performance, and associated methods.

BACKGROUND

Temperature is a physical quantity that provides a measure of the amount of perceived heat or cold, for example, in an object. A variety of apparatus are available for measuring temperature, for example, electronic devices or circuits. Generally, such apparatus are termed thermometers.

In some situations, electronic thermometers are used in order to measure the temperature of an object. Electronic thermometers can be used to measure air temperature, temperatures of liquids, gases, and the like. In some cases, electronic thermometers, for example, temperature sensors, are included in devices such as integrated circuits (ICs) to measure the temperature of various circuitry within the IC.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes a temperature measurement circuit. The temperature measurement circuit includes a bandgap circuit including an amplifier having an offset voltage that is compensated by using a set of trimming bits. The bandgap circuit provides first and second voltages related to a temperature to be measured. The temperature measurement circuit further includes a measuring circuit coupled to receive the first and second voltages. The measuring circuit further includes a comparator coupled to receive the first and second voltages, wherein the measuring circuit derives a temperature measurement from the first and second voltages.

According to another exemplary embodiment, an IC includes a temperature measurement circuit. The temperature measurement circuit includes a bandgap circuit including an amplifier that has (or might have) an offset voltage. The bandgap circuit provides first and second voltages related to a temperature of the IC. The bandgap circuit has first and second modes of operation, and the offset voltage of the amplifier is compensated in the first mode of operation of the bandgap circuit.

According to another exemplary embodiment, a method of measuring a temperature includes compensating an offset voltage of an amplifier by using a set of trimming bits, and generating, by using a bandgap circuit, first and second voltages related to the temperature, by using the amplifier. The method further includes using the first and second voltages to derive the temperature by generating count values corresponding to the first and second voltages.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to apparatus for electronic sensing or measurement of temperature. More specifically, the disclosed concepts provide apparatus and methods for electronic measurement (or sensing or both sensing and measurement) of temperature with improved performance.

More specifically, temperature measurement apparatus and associated methods according to various embodiments provide a number of benefits. Generally speaking, temperature measurement circuits according to exemplary embodiments have a ratio-metric architecture. As a result, the temperature measurement circuits are immune (or nearly immune, as realized in a practical, physical implementation) to circuit or component non-idealities, for example, semiconductor fabrication process variations.

Figure 1:
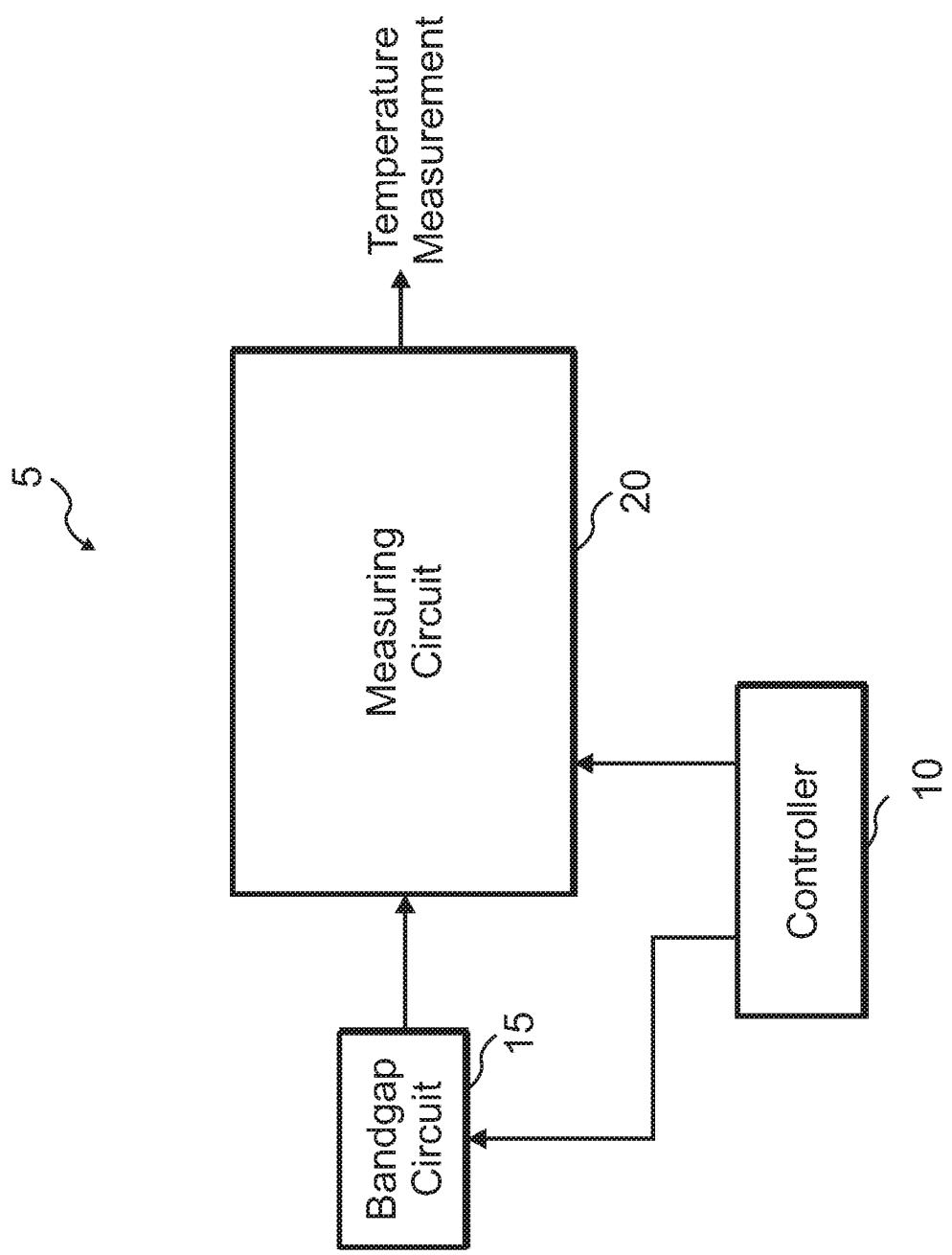
FIG. 1 shows a circuit arrangement for temperature sensing/measurement according to an exemplary embodiment.

FIG. 1 shows temperature measurement circuitry 5 according to an exemplary embodiment. The circuit arrangement includes bandgap circuit 15. As described below in detail, bandgap circuit 15 relies on measuring the base-emitter voltages ($V_{BE}$) of two bipolar junction transistors (BJTs) that have a relative current density ratio of n, where n denotes a positive number greater than unity.

Bandgap circuit 15 includes switches used to remove (or nearly remove, as realized in a practical, physical implementation) certain circuit non-idealities, as described below in detail. A controller 10 controls the operation of bandgap circuit 15, as described below.

A measuring circuit 20 receives the output of bandgap circuit 15. As described below in detail, measuring circuit 20 operates on the output of bandgap circuit 15 to derive a temperature measurement, which it provides as an output. Controller 10 is coupled to, and controls, the operation of measuring circuit 20. More specifically, controller 10 controls the operation of various components (or blocks or circuits) in measuring circuit 20.

Figure 2:
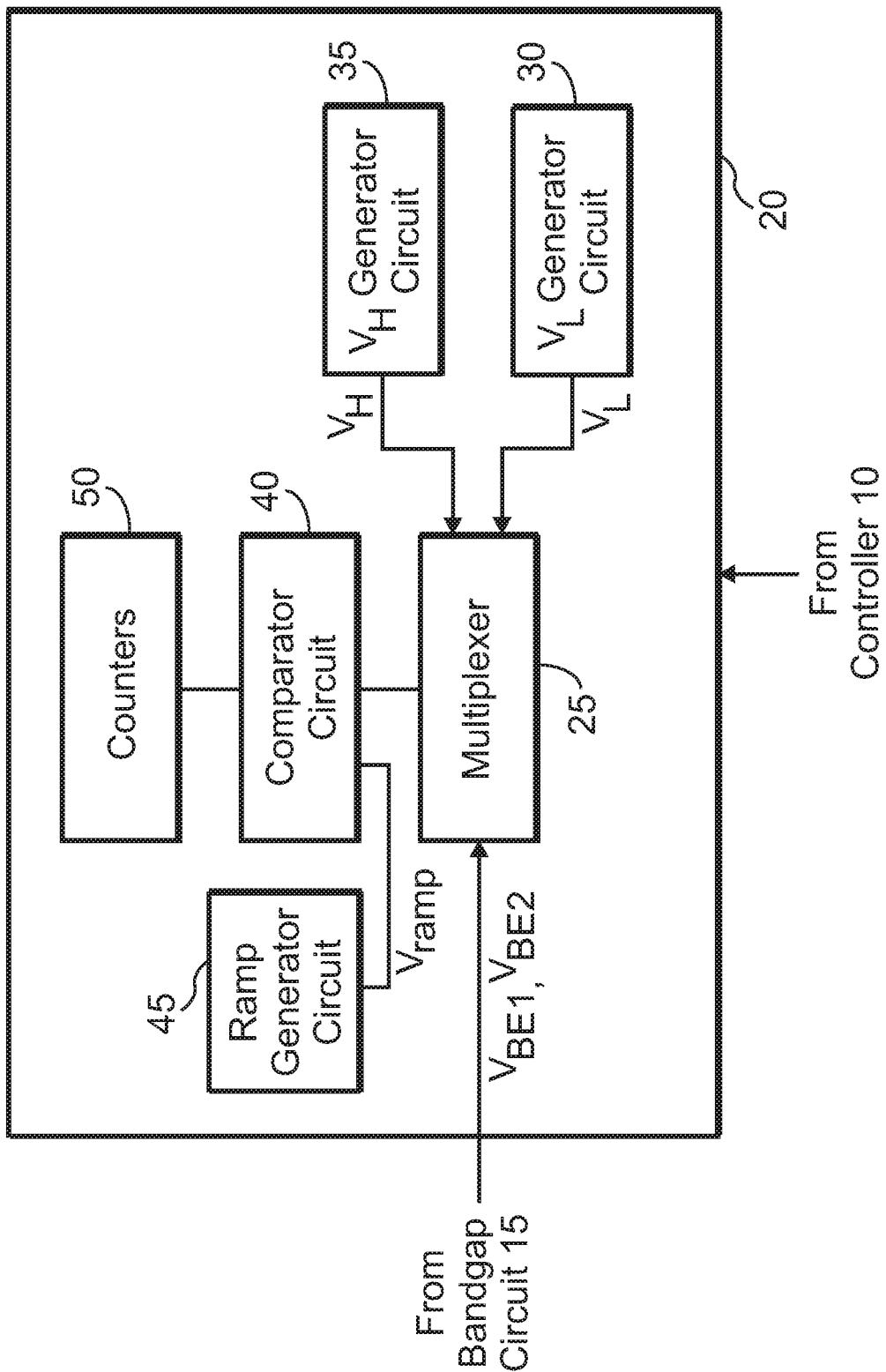
FIG. 2 shows a circuit arrangement for a measuring circuit according to an exemplary embodiment.

FIG. 2 shows a circuit arrangement for a measuring circuit 20 according to an exemplary embodiment. Measuring circuit 20 receives base-emitter voltages $V_{BE1}$ and $V_{BE2}$ from bandgap circuit 15. Base-emitter voltages $V_{BE1}$ and $V_{BE2}$ are provided to multiplexer (MUX) 25.

MUX 25 also receives a voltage $V_L$ from $V_L$ generator circuit 30. In addition, MUX 25 also receives a voltage $V_H$ from $V_H$ generator circuit 35. Voltages $V_L$ and $V_H$ are fixed (or relatively fixed, as realized by a practical implementation), and are used in the calculation of the temperature level, as sensed by bandgap circuit 15. The operation and details of $V_L$ generator circuit 30 and $V_H$ generator circuit 35 are described below in details.

The output of MUX 25 drives an input of comparator circuit 40. Ramp voltage $V_{ramp}$, generated by ramp generator circuit 45, drives another input of comparator circuit 40. Comparator circuit 40 compares the output of MUX 25 with the ramp voltage $V_{ramp}$. The output of comparator circuit 40 drives/controls one or more counters (generally shown as counters 50, although the number of counters ranges from one to several in various embodiments, as described below in detail).

Figure 3:
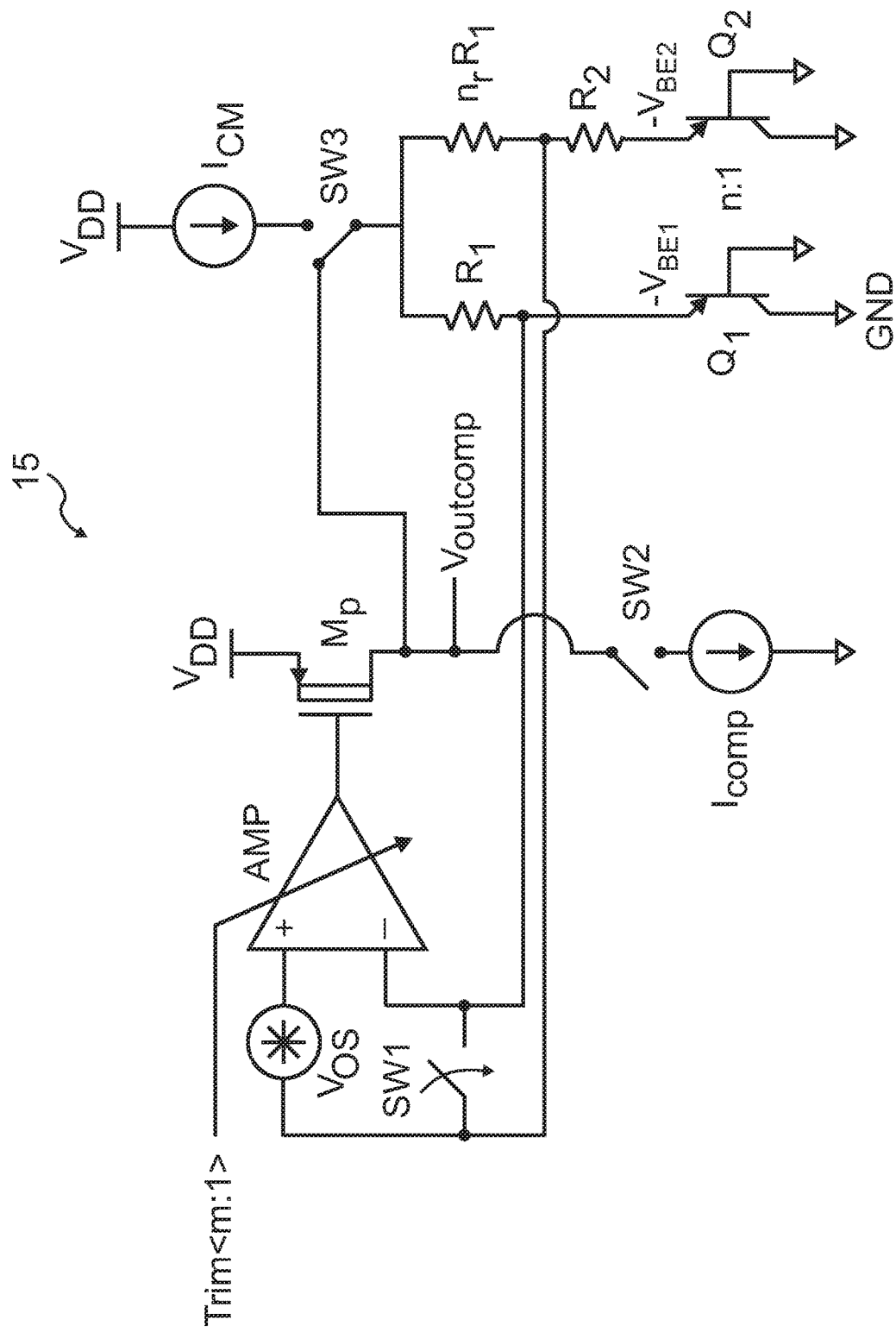
FIG. 3 shows a circuit arrangement for a bandgap circuit according to an exemplary embodiment.

FIG. 3 shows a circuit arrangement for a bandgap circuit 15 according to an exemplary embodiment. Bandgap circuit 15 includes BJTs $Q_1$ and $Q_2$. As noted above, transistors $Q_1$ and $Q_2$ have a n:1 current-density ratio, where n denotes a positive number greater than unity. Consequently, the base-emitter voltages of the two transistors are different.

More specifically, the well-known BJT equation may be used to relate the collector current to the base-emitter voltage:

$$I_c = I_0 e^{\left(\frac{V_{BE}}{V_{th}}\right)}$$

Applying the equation to transistors $Q_1$ and $Q_2$, the difference in the base-emitter voltages may be expressed as:

$$V_{BE1} - V_{BEn} = \Delta V_{BE} = \frac{kT}{q}\ln(n)$$

where $V_{BEn}$ represents the base-emitter voltage of transistor $Q_2$, signifying the n:1 relative current density ratio between transistors $Q_1$ and $Q_2$; T represents temperature; q denotes the charge of an electron ($1.6 \times 10^{-19}$ Coulombs); and K represents the Boltzmann constant ($1.38 \times 10^{-23}$). Thus, temperature, T, may be expressed as a function of the difference between the base-emitter voltages of transistors $Q_1$ and $Q_2$:

$$T = \frac{q}{K\ln(n)}\Delta V_{BE}$$

In other words, by measuring the difference between the base-emitter voltages of transistors $Q_1$ and $Q_2$, one may obtain a measure of temperature T. As noted above, and described below in detail, the temperature measurement circuit, for example as shown in FIG. 2, receives the base-emitter voltages of transistors $Q_1$ and $Q_2$, and derives temperature T based on the base-emitter voltages.

Referring again to bandgap circuit 15 in FIG. 3, bandgap circuit 15 also includes an amplifier labeled "AMP." The inverting input of the amplifier is coupled to the emitter of transistor $Q_1$ and to resistor $R_1$. The non-inverting input of the amplifier is coupled to resistor $R_2$. Resistor $R_2$ is coupled to the emitter of transistor $Q_2$, and to a resistor having a value $n_r R_1$, where $n_r$ represents the current density ratio of transistors $Q_1$ and $Q_2$ (the current density ratio n of the two BJTs, $Q_1$ and $Q_2$, is given by multiplying the ratio of the emitter currents of the two BJTs, set by the value of $n_r$, and the ratio of the emitter areas of the two BJTs).

Resistor $R_1$ is also coupled to switch SW3. Similarly, resistor $n_r R_1$ is also coupled to switch SW3. Switch SW3 selectively couples resistor $R_1$ and resistor $n_r R_1$ to either the drain of transistor $M_p$ or to a common mode current source $I_{CM}$. More specifically, during the offset trimming mode, switch SW3 couples the common mode current source $I_{CM}$ to resistors $R_1$ and $n_r R_1$. Conversely, during the temperature measurement mode, switch SW3 couples the drain of transistor $M_p$ to resistors $R_1$ and $n_r R_1$.

The amplifier generates an output voltage that forces its input terminals to have ideally equal voltages. In other words, the amplifier generates an output voltage that forces the emitter voltage of transistor $Q_1$ (given that the base is grounded) to equal the voltage across resistor $R_2$ plus the emitter voltage of transistor $Q_2$. To do so, a metal oxide semiconductor field effect transistor (MOSFET) $M_p$ is coupled to the amplifier's output. More specifically, the output of the amplifier drives the gate of transistor $M_p$. The source of transistor $M_p$ is coupled to the supply voltage, $V_{DD}$. The drain of transistor $M_p$ is coupled to switches SW2 and SW3.

Switch SW2, when closed (during the offset trimming mode, described below), couples the drain of transistor $M_p$ to a bias current source $I_{comp}$. During the temperature measurement mode, however, switch SW2 is open. Note that during the temperature measurement mode switch SW3 couples the drain of transistor $M_p$ to resistors $R_1$ and $n_r R_1$, as described above.

In a practical implementation, the amplifier exhibits non-idealities, such as an offset voltage (denoted as voltage source $V_{os}$). If not compensated for or if left untreated, the offset voltage degrades the performance of the bandgap circuit as a temperature sensing circuit. To overcome the effect of the offset voltage, the amplifier is trimmed every time a temperature measurement is performed (e.g., under the control of controller 10, shown in FIG. 1). More specifically, referring again to FIG. 3, bandgap circuit 15 has two operating modes, a sensing mode and an offset trimming mode.

In the offset trimming mode, the amplifier is operated as a comparator whose output will be the ground potential or the supply voltage ($V_{DD}$) for sufficiently large values of amplifier/comparator gain. By virtue of resistors $R_1$ and $n_r R_1$ being coupled to common mode current source $I_{CM}$ (via switch SW3), the amplifier's input voltages are relatively close to their values when bandgap circuit 15 is in the temperature measurement mode.

Switch SW1 is closed to short together the two inputs of the amplifier. As a result, the amplifier will have a differential input voltage equal to its offset voltage (denoted as voltage source $V_{os}$). Transistor $M_p$ and bias current $I_{comp}$ act as a second amplification stage to amplify the amplifier's output voltage. The value of bias current source $I_{comp}$ is chosen such that its value is close to the value of the current flowing through transistor $M_p$ in the temperature measurement mode. Note that reusing transistor $M_p$ as a part of the offset trimming circuitry eliminates its contribution to the offset as well.

Given that the current flowing through transistor $M_p$ in the temperature measurement mode is proportional to absolute temperature (a so-called PTAT current), $I_{comp}$ and $I_{CM}$ are generated using a separate PTAT current generator. The PTAT current generator circuit is well known to persons of ordinary skill in the art.

A set of m trimming bits (labeled "Trim<m:1>" in FIG. 3) are used to compensate for offset voltages in the circuit. More specifically, the trimming bits are added to the amplifier in order to reduce or drive its offset voltage to zero (or nearly zero in a practical implementation), using a binary search technique, or any other suitable technique, as persons of ordinary skill in the art will understand.

In some embodiments, depending on the values of the trimming bits, current is injected into the left or right branches of a differential amplifier used in amplifier AMP. In some embodiments, depending on the values of the trimming bits, different values of resistors are used in the input circuitry that are subject to the input bias current which gives rise to the offset voltage. In exemplary embodiments, a variety of offset trimming techniques and circuitry may be used, as persons of ordinary skill in the art will understand.

As noted above, transistors $Q_1$ and $Q_2$ have a relative current density ratio of n. In some embodiments, the ratio n can be achieved by scaling the current in one device relative to the other. In some embodiments, the ratio may be achieved by scaling the area of one device relative to the other. In some embodiments, both of the foregoing techniques are used, for instance, in situations where a larger current density ratio is desired.

Figure 4:
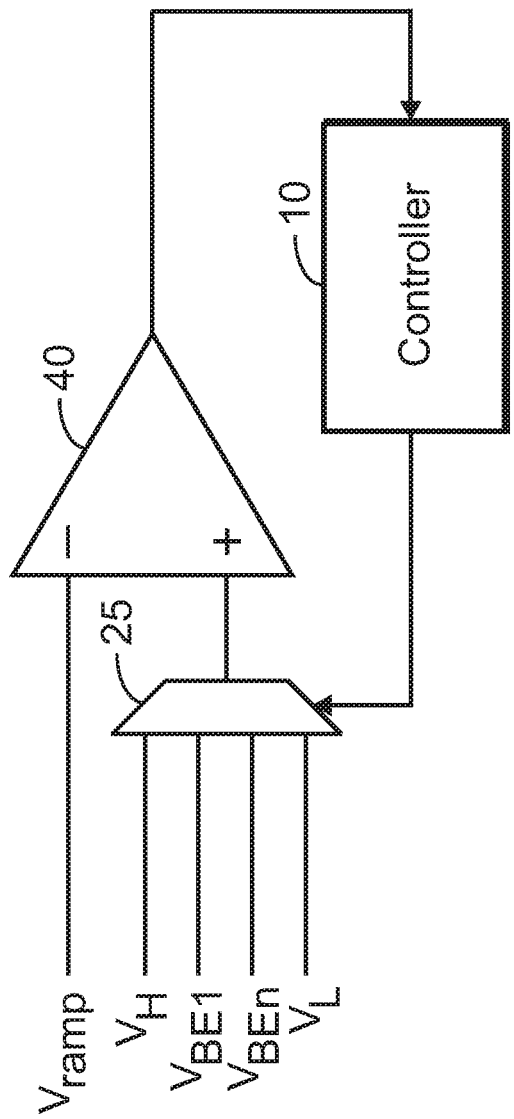
FIG. 4 shows a circuit arrangement for a comparator and multiplexer (MUX) used for temperature sensing/measurement according to an exemplary embodiment.

As noted above, bandgap circuit 15 provides the difference between the emitter base voltages of transistors $Q_1$ and $Q_2$, i.e., $\Delta V_{BE}$ (or alternatively the base emitter voltages of transistors $Q_1$ and $Q_2$, to be used by measuring circuit 20 to calculate $\Delta V_{BE}$) to measurement circuit 20. Inverting circuitry (not shown), such as a pair of buffers with gain −1, is used to convert voltages $-V_{BE1}$ and $-V_{BE2}$ (shown in FIG. 3) to $V_{BE1}$ and $V_{BE2}$, respectively, and provide those voltages to measuring circuit 20. As further noted above, measuring circuit 20 uses in part MUX 25 and comparator 40 to measure the temperature value. FIG. 4 shows further details of how MUX 25 and comparator 40 operate according to an exemplary embodiment.

More specifically, MUX 25 receives voltage $V_L$, voltage $V_H$, base emitter voltage $V_{BE1}$ (for transistor $Q_1$), and base emitter voltage $V_{BEn}$ (for transistor $Q_2$). The output signal of comparator 40 is used by controller 10 to set the control (or select) signals of MUX 25, which selects one of the four input voltage to be coupled to the non-inverting input of comparator 40. A finite-state machine (FSM) (or other appropriate circuitry, as persons of ordinary skill in the art will understand) in controller 10 is initialized to select $V_H$, and once the output of comparator 40 triggers, the FSM changes the control signals of MUX 25 to select $V_{BE1}$ so that the output of comparator 40 goes low again (given that the voltage $V_{BE1}$ is less than the ramp voltage at that instant of time). Once the ramp voltage crosses $V_{BE1}$, the FSM moves to the next state and selects $V_{BEn}$. Similarly, once comparator 40 triggers again, the FSM sets the control signals of MUX 25 such that $V_L$ is coupled to the non-inverting input of comparator 40. Ramp voltage $V_{ramp}$ drives the inverting or negative input of comparator 40.

In exemplary embodiments, voltage $V_L$ has a value that is lower than voltage $V_H$. For example, in an exemplary embodiment, voltage $V_L$ has the value 0.3 volts, whereas voltage $V_H$ has the value of one volt. As persons of ordinary skill in the art will understand, however, other values of voltages $V_L$ and $V_H$ are possible and contemplated. The choices of the values of voltages $V_L$ and $V_H$ depend on factors such as design and performance specifications or goals for a given implementation, as persons of ordinary skill in the art will understand. Generally speaking, voltage $V_H$ is greater than voltage $V_{BE1}$ across the temperature range of interest (the temperature range sought to be measured), and voltage $V_L$ is less than voltage $V_{BEn}$ across the temperature range of interest.

Figure 5:
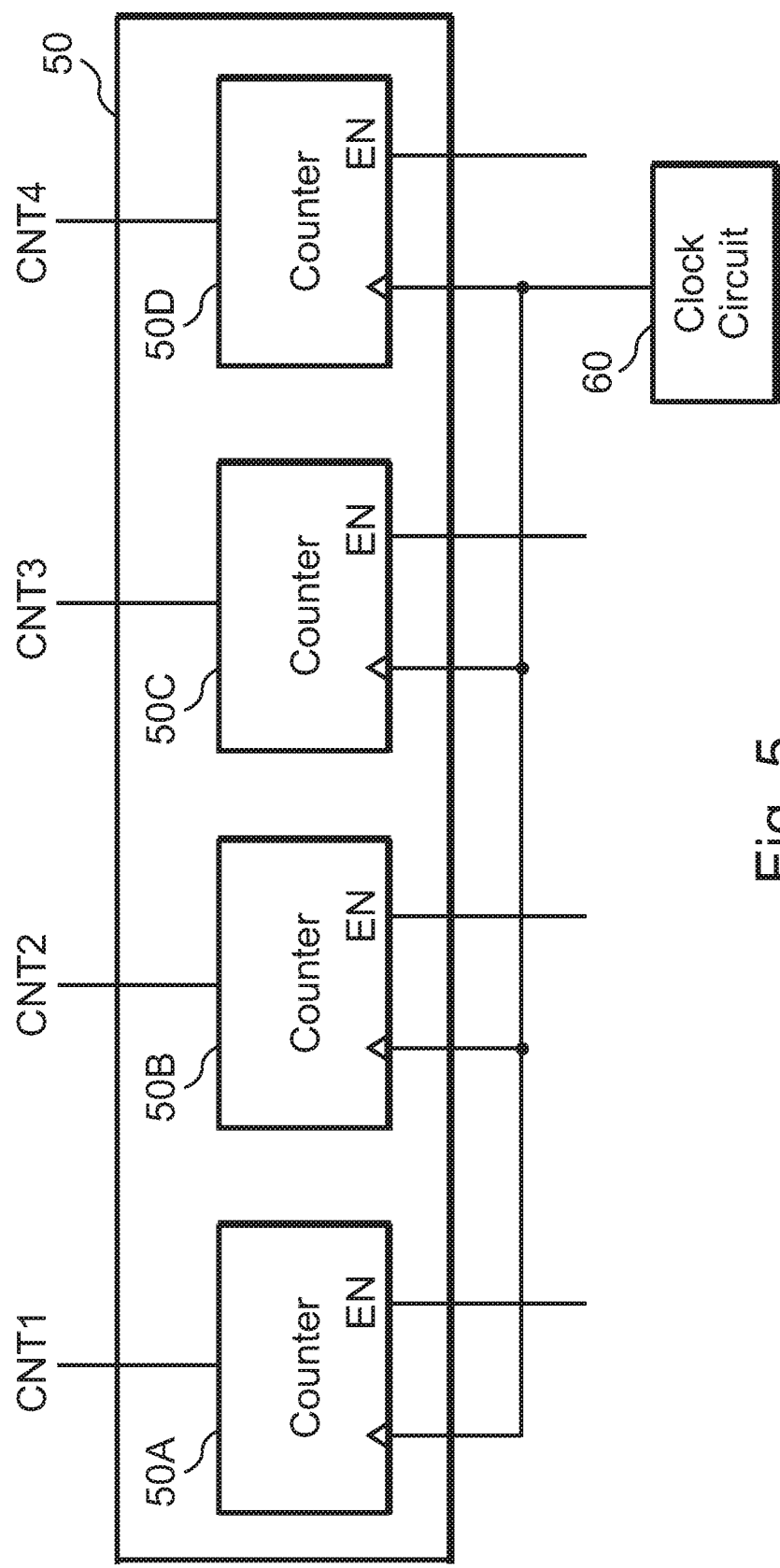
FIG. 5 shows a circuit arrangement for counters used for temperature sensing/measurement according to an exemplary embodiment.

As noted above, measurement circuit 20 uses one or more counters. FIG. 5 shows a set of counters 50 used for temperature sensing/measurement according to an exemplary embodiment. Although FIG. 5 shows four counters 50A-50D, other numbers of counters may be used in other embodiments, as described below in detail.

Referring to the embodiment shown in FIG. 5, counters 50A-50D are clocked by a clock signal provided by clock circuit 60. Clock circuit 60 may be realized in a variety of ways, as persons of ordinary skill in the art will understand. For example, in some embodiments a crystal oscillator may be used to generate the clock signal. Other arrangements are possible and are contemplated, as persons of ordinary skill in the art will understand. Generally, the choice of circuitry for a given implementation depends on a variety of factors, as persons of ordinary skill in the art will understand. Such factors include design specifications, performance specifications (e.g., accuracy or precision of the temperature measurement), cost, IC or device area, available technology (such as semiconductor fabrication technology), target markets, target end-users, etc.

Counters 50A-50D have corresponding enable inputs that are used to cause the corresponding counter to count the clock cycles provided by clock circuit 60. Counters 50A-50D have corresponding outputs CNT1-CNT4 that correspond to the number of clock cycles counted between the assertion and de-assertion of the enable signal for the corresponding counter.

Counters 50A-50D operate as follows. Assuming a negative-going ramp voltage, $V_{ramp}$, provided by ramp generator circuit 45 (see FIG. 2), at the beginning, the ramp will start at a voltage higher than the voltage $V_H$ while MUX 25 (see FIGS. 2-3) couples the voltage $V_H$ to the positive input of comparator 40 (see FIGS. 2-3). Referring again to FIG. 4, counters 50A-50D start from the same reset value, which may be set in a number of ways, for example, by using controller 10 (see FIG. 1). Once the ramp voltage becomes equal to voltage $V_H$, the output of comparator 40 output goes high (logic high), counter 50A is disabled, and the number of counts that it has, $N_H$, is retained.

Next, MUX 25 switches the comparator input from the voltage $V_H$ to the voltage $V_{BE1}$. Given that the voltage $V_{BE1}$ is less than the ramp voltage at that moment, the comparator output goes back low. Once the ramp voltage becomes equal to the voltage $V_{BE1}$, the output of comparator 40 goes high again, and this time counter 50B is disabled (by de-asserting its enable output), and its output count, $N_1$, is retained. Next, MUX 25 switches the comparator input to the voltage $V_{BEn}$. Similarly, when the output of comparator 40 goes high, counter 50C is disabled and its output, $N_n$, is retained. MUX 25 then switches the input of comparator 40 to the voltage $V_L$. Once the ramp voltage is equal to the voltage $V_L$, counter 50D is disabled and its output, $N_L$, is retained.

Controller 10 monitors the output signal of comparator 40 (see FIG. 4), as noted above. The FSM (or other suitable circuit) in controller 10 enables/disables counters 50A-50D based on the current state of measuring circuit 20.

The retained counts of counters 50A-50D, i.e., $N_H$, $N_1$, $N_n$, and $N_L$, respectively, are used to calculate the temperature represented by the base-emitter voltage difference ($\Delta V_{BE}$). More specifically, the retained counts $N_H$, $N_1$, $N_n$, and $N_L$ correspond, respectively, to the voltages $V_H$, $V_{BE1}$, $V_{BEn}$, and $V_L$ respectively. The retained counts may therefore be used to calculate the base-emitter voltage difference ($\Delta V_{BE}$), given that voltages $V_H$ and $V_L$ are known.

More specifically, by subtracting retained count $N_H$ from retained count $N_L$, the number of counts that corresponds to the voltage difference $V_H$-$V_L$ (a known voltage, given that voltages $V_H$ and $V_L$ are known) may be obtained. Similarly, by subtracting retained count $N_1$ from retained count $N_n$, the number of clock cycles that corresponds to the quantity $V_{BE1}$-$V_{BEn}$ is obtained.

Given that the quantity $V_H$-$V_L$ is known, the quantity $V_{BE1}$-$V_{BEn}$ is calculated as $$V_{BE1} - V_{BEn} = \Delta V_{BE} = (V_H - V_L)\frac{(N_1 - N_n)}{(N_H - N_L)}$$

The base-emitter voltage difference, $\Delta V_{BE}$, in turn is used to calculate the temperature. More specifically, the temperature T is proportional to the voltage $\Delta V_{BE}$ as follows:

$$T = \frac{q}{K\ln(n)}\Delta V_{BE}$$

Figure 6:
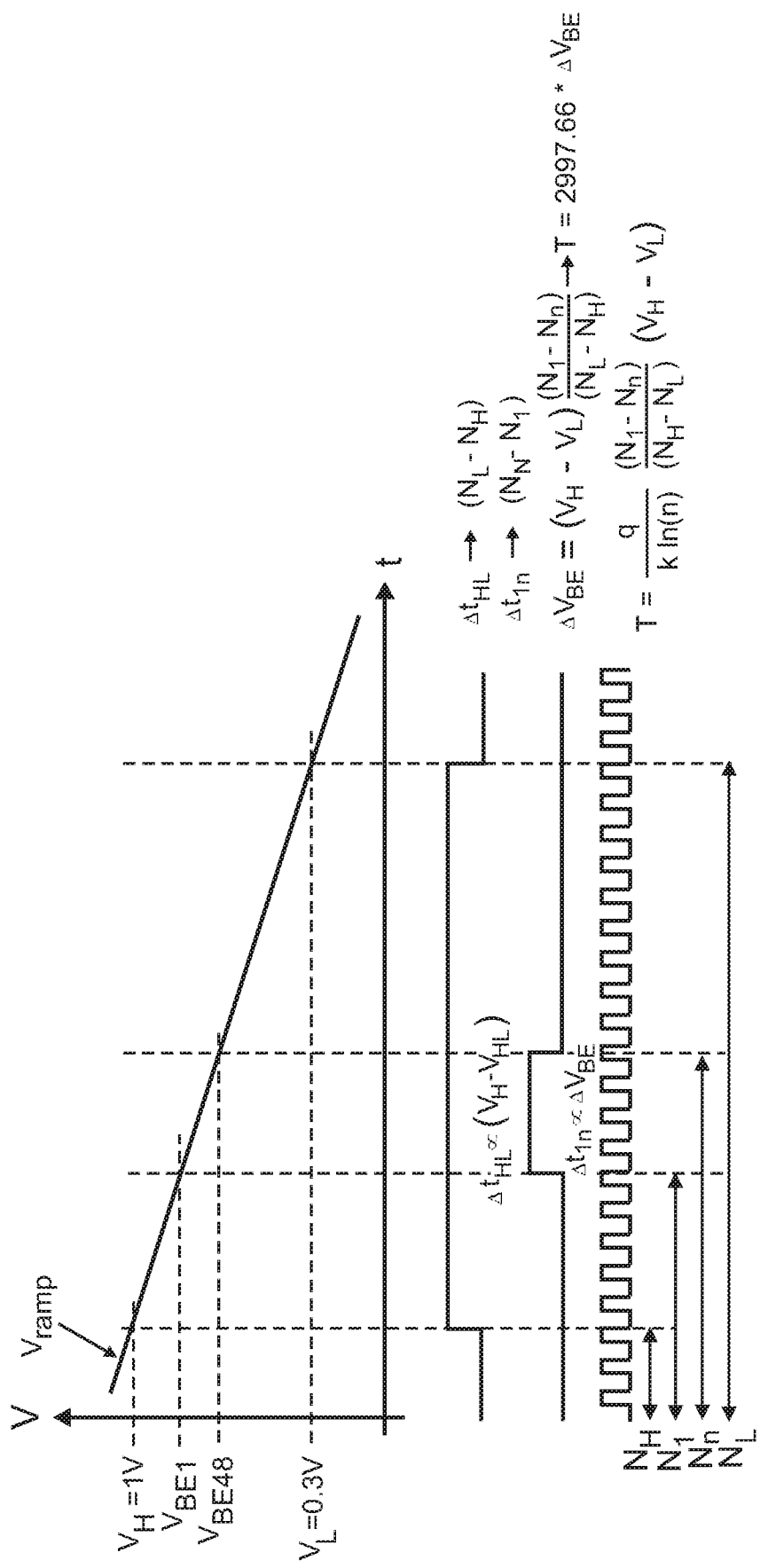
FIG. 6 shows graphs of various voltages in a temperature sensing/measurement apparatus according to an exemplary embodiment.

FIG. 6 shows graphs of various voltages in a temperature measurement apparatus according to an exemplary embodiment. In the example shown, the voltage $V_H$ has a value of one volt, whereas the voltage $V_L$ has a value of 0.3 volts. Furthermore, the current density ratio is 48, hence the use of the label $V_{BE48}$ to illustrate the base-emitter voltage of transistor $Q_2$ (see FIG. 3).

The temperature measurement scheme described above may be improved, as desired. For example, in addition to counting the number of clock cycles corresponding to each input voltage of MUX 25 (see FIG. 4), the clock phase at the moment the output of comparator 40 output goes high can be captured and retained. If counters 50A-50D are operating (incrementing their respective count values) on the positive edge of the clock signal and the output of comparator 40 goes high while the clock is low, the number of counts can be increased by 0.5. On the other hand, if the output of comparator 40 goes high while the clock is high, then the number of counts can be kept unchanged. By employing the information of the clock phase at the moment that the output of comparator 40 goes high, the temperature measurement resolution can be doubled.

Figure 7:
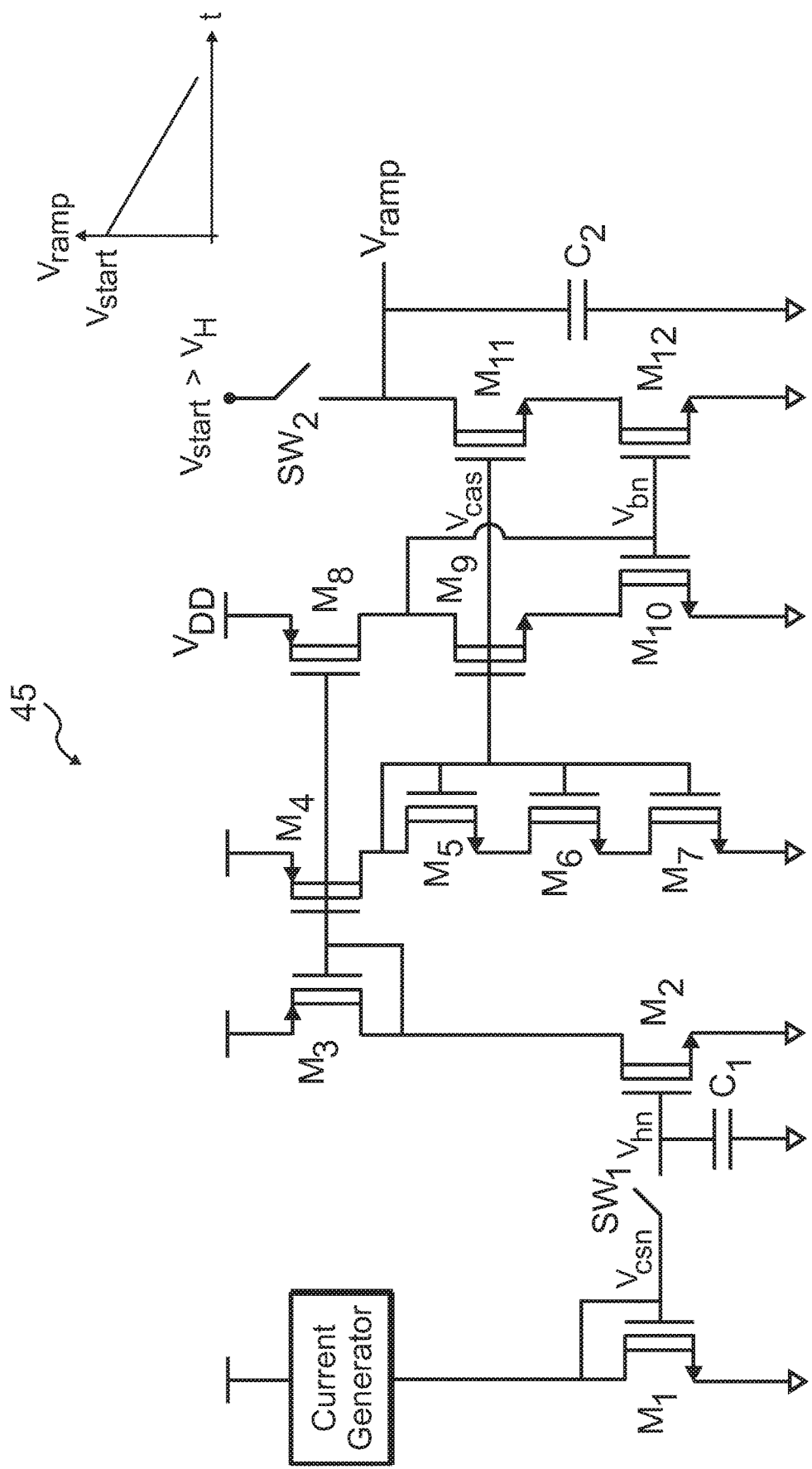
FIG. 7 shows a circuit arrangement for a ramp generator used for temperature sensing/measurement according to an exemplary embodiment.

As noted above, temperature measurement circuit 20 uses ramp voltage generator 45. FIG. 7 shows a circuit arrangement for ramp generator 45 according to an exemplary embodiment. Ramp generation as in ramp generator circuit 45 shown in the figure initially charges capacitor $C_2$ to a starting voltage $V_{start}$ before a current source, implemented using transistors $M_{11}$ and $M_{12}$, is used to discharge capacitor $C_2$. Assuming that capacitor $C_2$ has a constant capacitance value, and assuming a constant discharging current, the voltage across capacitor $C_2$ is a negative-going linear ramp that starts from voltage $V_{start}$ and ramps down to zero or ground potential.

Prior to the temperature measurement, the current generator (labeled "Current Generator") generates an input current that is converted to a voltage, $V_{csn}$, using the diode-connected transistor $M_1$. The Current Generator may be implemented using a complementary MOS (CMOS), n-channel metal oxide semiconductor (NMOS), or p-channel MOS (PMOS) circuitry, as desired, and as persons of ordinary skill in the art will understand.

Referring again to FIG. 7, switch $SW_1$, which is closed at this time, passes the voltage $V_{csn}$ to the gate of transistor $M_2$. Transistors $M_3$ and $M_8$ mirror the current of transistor $M_2$ to an n-channel metal oxide semiconductor (NMOS) output stage mirror, which is implemented by transistors $M_{10}$ and $M_{12}$. In order to realize a relatively large output impedance for the current source that discharges capacitor $C_2$ (i.e., in order to improve the linearity of the ramp voltage), cascode transistors $M_9$ and $M_{11}$ are used.

The cascode voltage is generated using transistors $M_4$ through $M_7$. On the other hand, switch $SW_2$, which is also closed, sets the initial voltage across capacitor $C_2$ to $V_{start}$, which is larger than $V_H$. At the beginning of the temperature measurement mode, switch $SW_2$ is opened, such that the current source, transistors $M_{11}$ and $M_{12}$, can discharge capacitor $C_2$. In addition, switch $SW_1$ is opened, and its input voltage, $V_{csn}$, is sampled-and-held on capacitor $C_1$.

Given that switch $SW_1$ is open, any change in the input current from the Current Generator does not affect the discharging current. Consequently, the circuit noise of the Current Generator and transistor $M_1$ do not adversely affect the ramp voltage.

In a variation of the embodiment shown, the initial voltage may be started at a voltage below the voltage $V_L$, and charge capacitor $C_2$ in order to increase its terminal voltage towards the voltage $V_H$. This scheme can be accomplished with a mirrored version of the circuit shown in FIG. 7, as persons of ordinary skill in the art will understand. More specifically, PMOS transistors are swapped or replaced with NMOS transistors, and vice-versa. In addition, the supply voltage ($V_{DD}$) and the ground potential are swapped. In such a scheme, the order of comparisons would be $V_L$, $V_{BEn}$, $V_{BE1}$, and finally $V_H$.

Figure 8:
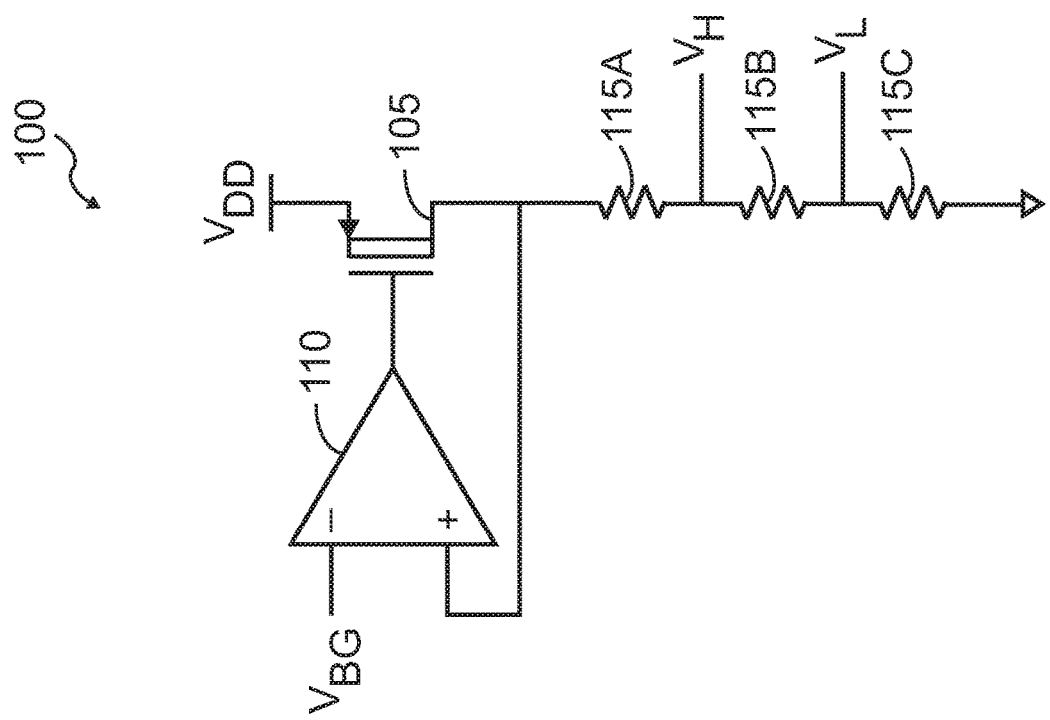
FIG. 8 shows a circuit arrangement for a voltage generator used for temperature sensing/measurement according to an exemplary embodiment.

FIG. 8 shows a circuit arrangement 100 for a voltage generator used to generate voltages $V_H$ and $V_L$ according to an exemplary embodiment. In circuit arrangement 100, an amplifier 110 receives as one of its inputs a bandgap voltage $V_{BG}$. Bandgap voltage $V_{BG}$ may be generated using a conventional bandgap circuit or any circuit that provides a voltage that is fixed (or substantially or nearly fixed in a practical implementation) with changes in temperature, as persons of ordinary skill in the art will understand.

Amplifier 110 and transistor 105 are coupled in a negative feedback loop. More specifically, amplifier 110 causes the voltage at the drain of transistor 105 to equal (or substantially or nearly equal in a practical implementation) the bandgap voltage $V_{BG}$. Thus, the voltage across the resistor string realized by resistors 115A-115C is equal (or substantially or nearly equal in a practical implementation) to the bandgap voltage, $V_{BG}$.

Given that the voltage across the resistor string is known, two taps of the resistor string are used to provide the voltages $V_H$ and $V_L$. In order to improve the accuracy of the temperature measurement, the voltages $V_H$ and $V_L$ can be measured, for example, during the production of an IC that includes the temperature measurement circuitry, and their values may be used in the temperature calculations described above. The measured values of the voltages $V_H$ and $V_L$ can be stored on-chip, for example, in a flash or one-time-programmable (OTP) memory, as desired.

Given that the bandgap voltage $V_{BG}$ is relatively constant with temperature, the voltages $V_H$ and $V_L$ are also relatively constant with temperature. The offset voltage of amplifier 110 can be trimmed using the offset trimming circuitry and techniques described above, as desired.

Although circuit arrangement 100 in the embodiment shown generates both voltages $V_H$ and $V_L$, separate or individual circuits may be used to generate those voltages, as desired, and as persons of ordinary skill in the art will understand. Furthermore, if suitable voltages are available (e.g., from an on-chip reference voltage generator), such voltages may be used to provide one or both of voltages $V_H$ and $V_L$.

As persons of ordinary skill in the art will understand, the embodiments shown for ramp voltage generation and the generation of voltages $V_H$ and $V_L$ are merely exemplary and illustrative. A variety of other circuits may be used and are contemplated. The choice of circuitry for a given implementation depends on a variety of factors, as persons of ordinary skill in the art will understand. Such factors include design specifications, performance specifications, cost, IC or device area, available technology, such as semiconductor fabrication technology, target markets, target end-users, etc.

The circuitry shown in various figures, for example, FIGS. 3 and 7, use a number of switches. The switches may be realized or implemented using a variety of techniques and circuits or components/devices, as persons of ordinary skill in the art will understand. For example, and without limitation, in some embodiments, one or more of the switches may be implemented using MOSFETs (n-channel or p-channel, depending on a particular switch, as persons of ordinary skill in the art will understand). The choice of circuitry used to realize switches for a given implementation depends on a variety of factors, as persons of ordinary skill in the art will understand. Such factors include design specifications, performance specifications, cost, IC or device area, available technology, such as semiconductor fabrication technology, target markets, target end-users, etc.

Temperature sensing/measuring apparatus and associated methods according to various embodiments provide a number of benefits. For example, the absolute slope of the ramp voltage does not affect the accuracy of the temperature measurement. Thus, if the slope of the ramp is different from one IC to another or from one measurement to another, the accuracy of the temperature measurement will not be affected.

As another example, the temperature measurement does not depend on the absolute frequency of the clock signal. A variety of clock sources with relatively similar frequencies can be used in various embodiments. As long as the clock frequency does not change (or changes by relatively small amounts in a practical implementation) during a given temperature measurement, the clock frequency may change between different measurements without affecting the accuracy of the measurement. Thus, in some situations, such as where temperature measurement in a low-power circuit (e.g., a circuit operated using portable power sources, such as a battery), clock source 60 (see FIG. 5) may be turned off (or disabled or inhibited or placed in a low-power mode) between measurements.

As another example of a benefit, the effect of the offset voltage of comparator 40 is canceled in the temperature measurement. More specifically, the offset voltage affects the four retained counts, corresponding to the voltages comparisons described above, in the same way. Thus, the offset voltage of comparator 40 does not affect the accuracy of the temperature measurement.

Figure 9:
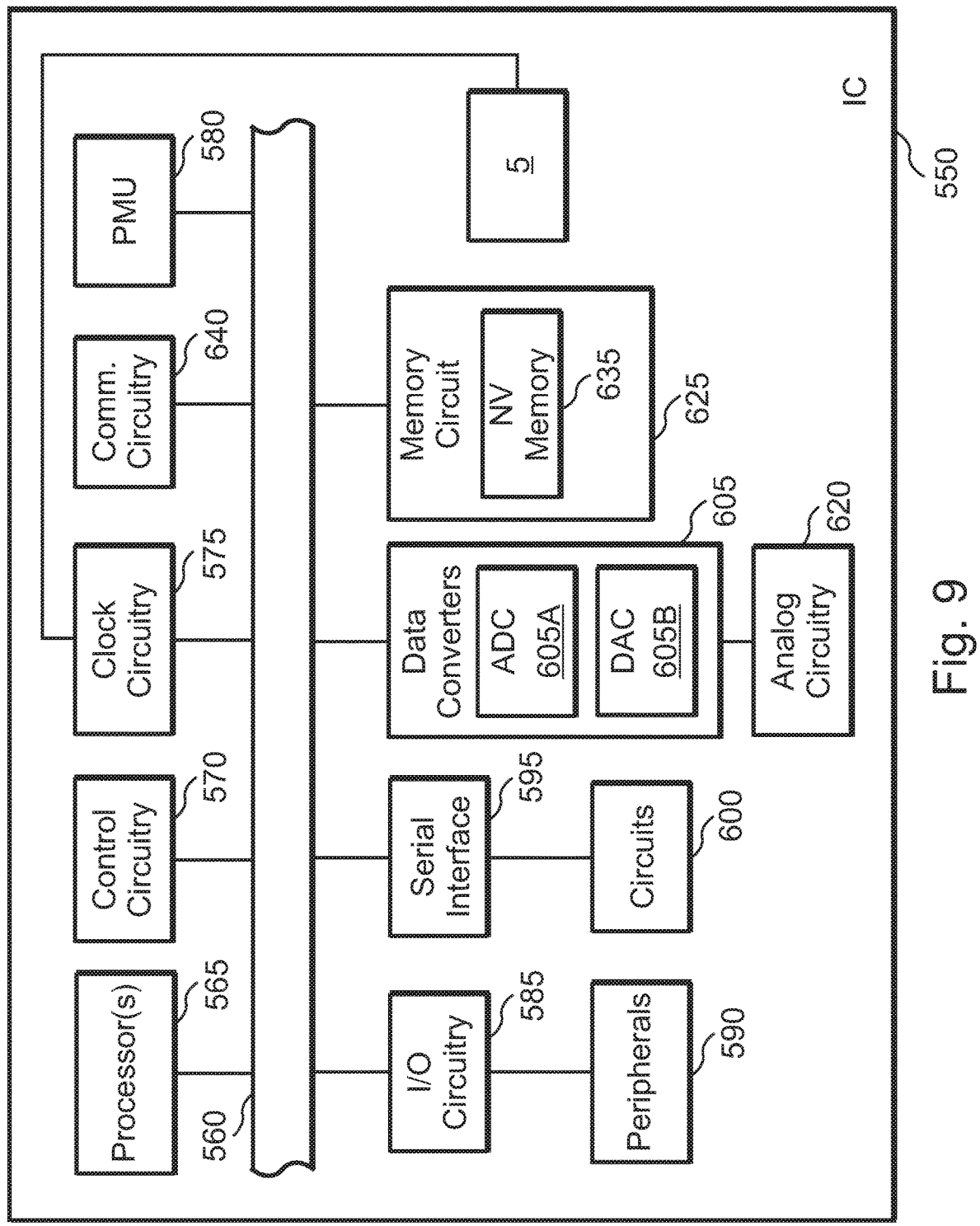
FIG. 9 shows a circuit arrangement for temperature sensing/measurement in an IC according to an exemplary embodiment.

Temperature measurement circuitry and techniques according to various embodiments may be used in a variety of circuits, blocks, subsystems, and/or systems. For example, in some embodiments, the temperature measurement circuitry and techniques may be integrated in an IC, such as an MCU. FIG. 9 shows a circuit arrangement for such an exemplary embodiment.

The circuit arrangement includes an IC 550, which constitutes or includes an MCU. IC 550 includes a number of blocks (e.g., processor(s) 565, data converter(s) 605, I/O circuitry 585, etc.) that communicate with one another using a link 560. In exemplary embodiments, link 560 may constitute a coupling mechanism, such as a bus, a set of conductors or semiconductor elements (e.g., traces, devices, etc.), for communicating information, such as data, commands, status information, and the like.

IC 550 may include link 560 coupled to one or more processors 565, clock circuitry 575, and power management circuitry or power management unit (PMU) 580. In some embodiments, processor(s) 565 may include circuitry or blocks for providing information processing (or data processing or computing) functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560, as desired. In some embodiments, clock circuitry 575 may provide one or more clock signals via link 560 to other blocks in IC 550.

In the embodiment shown, temperature measurement circuitry 5 is coupled to clock circuitry 575. Temperature measurement circuitry 5 provides the temperature of IC 550 (or the temperature of a desired component, block, circuit, or device in IC 550) to clock circuitry 575. Based on the temperature provided by temperature measurement circuitry 5, clock circuitry 575 may change or vary the clock signal(s) provided to one or more blocks in IC 550.

For example, if temperature measurement circuitry 5 provides a temperature value that exceeds a desired or given threshold value, clock circuitry 575 may reduce the frequency of one or more clock signals provided to one or more blocks in IC 550. As a result of reducing the frequency of the clock signal(s), circuitry in the desired block(s) operate at a lower clock frequency and, thus, reduce less power. Consequently, the temperature of such blocks is reduced, for example, to a safe value or to a value indicated by the safe-operating area characteristics of the block(s) (or a circuit, device, component, etc. in the block(s)).

In some embodiments, PMU 580 may reduce an apparatus's (e.g., IC 550) clock speed, turn off the clock, reduce power, turn off power, disable (or power down or place in a lower power consumption or sleep or inactive or idle state), enable (or power up or place in a higher power consumption or normal or active state) or any combination of the foregoing with respect to part of a circuit or all components of a circuit, such as one or more blocks in IC 550. Further, PMU 580 may turn on a clock, increase a clock rate, turn on power, increase power, or any combination of the foregoing in response to a transition from an inactive state to an active state (including, without limitation, when processor(s) 565 make a transition from a low-power or idle or sleep state to a normal operating state).

Link 560 may couple to one or more circuits 600 through serial interface 595. Through serial interface 595, one or more circuits or blocks coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with one or more blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, sensors, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. In some embodiments, such peripherals may be external to IC 550, as described above.

Link 560 may couple to analog circuitry 620 via data converter(s) 605. Data converter(s) 605 may include one or more ADCs 605A and/or one or more DACs 605B. ADC(s) 605A receive analog signal(s) from analog circuitry 620, and convert the analog signal(s) to a digital format, which they communicate to one or more blocks coupled to link 560. Conversely, DAC(s) 605B receive digital signal(s) from one or more blocks coupled to link 560, and convert the digital signal(s) to analog format, which they communicate to analog circuitry 620.

Analog circuitry 620 may include a wide variety of circuitry that provides and/or receives analog signals. Examples include sensors, transducers, and the like, as persons of ordinary skill in the art will understand. In some embodiments, analog circuitry 620 may communicate with circuitry external to IC 550 to form more complex systems, sub-systems, control blocks or systems, feedback systems, and information processing blocks, as desired.

Control circuitry 570 couples to link 560. Thus, control circuitry 570 may communicate with and/or control the operation of various blocks coupled to link 560 by providing control information or signals. In some embodiments, control circuitry 570 also receives status information or signals from various blocks coupled to link 560. In addition, in some embodiments, control circuitry 570 facilitates (or controls or supervises) communication or cooperation between various blocks coupled to link 560.

In some embodiments, control circuitry 570 may initiate or respond to a reset operation or signal. The reset operation may cause a reset of one or more blocks coupled to link 560, of IC 550, etc., as persons of ordinary skill in the art will understand. For example, control circuitry 570 may cause PMU 580, and circuitry such as controller 10 (see FIG. 1), to reset to an initial or known state.

Referring again to FIG. 9, in exemplary embodiments, control circuitry 570 may include a variety of types and blocks of circuitry. In some embodiments, control circuitry 570 may include logic circuitry, FSMs, or other circuitry to perform operations such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples of communications include USB, Ethernet, and the like. In exemplary embodiments, other communication protocols may be used, depending on factors such as design or performance specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc.

Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, DDR4, and the like, as desired.

In some embodiments, memory read and/or write operations by memory circuit 625 involve the use of one or more blocks in IC 550, such as processor(s) 565. A direct memory access (DMA) arrangement (not shown) allows increased performance of memory operations in some situations. More specifically, DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown), such as random access memory (RAM).

NV memory 635 may be used for storing information related to performance, control, or configuration of one or more blocks in IC 550. For example, NV memory 635 may store configuration information related to measured voltages (e.g., voltages $V_L$ and $V_H$), as described above. Alternatively, or in addition, NV memory 635 may store various parameters related to the temperature measurement, such as the clock frequency used, etc., as persons of ordinary skill in the art will understand.

Figure 10:
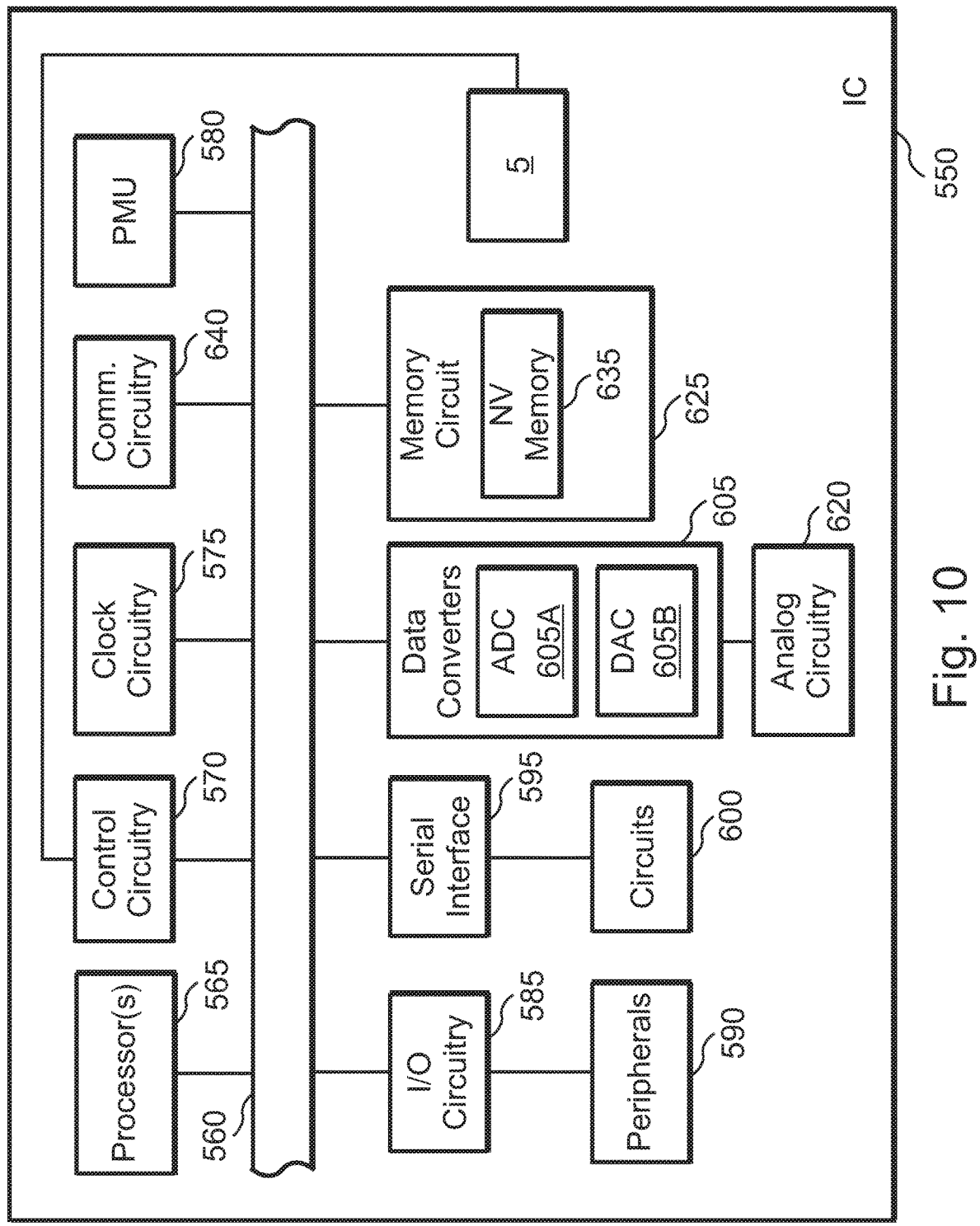
FIG. 10 shows a circuit arrangement for temperature sensing/measurement in an IC according to another exemplary embodiment.

FIG. 10 shows a circuit arrangement for temperature sensing/measurement in IC 550 according to another exemplary embodiment. In this embodiment, temperature measurement circuitry 5 is coupled to control circuitry 570. Temperature measurement circuitry 5 provides the temperature of IC 550 (or the temperature of a desired component, block, circuit, or device in IC 550) to control circuitry 570.

Based on the temperature provided by temperature measurement circuitry 5, control circuitry 570 may control one or more blocks in IC 550 to change or vary its operation. For example, if temperature measurement circuitry 5 provides a temperature value that exceeds a desired or given threshold value, control circuitry 570 may cause one or more blocks in IC 550 to shut down (or be disabled or inhibited) in order to protect the block(s) and, thus, IC 550.

As another example, control circuitry 570 can use the temperature value provided by temperature measurement circuitry 5 to control rate of charge of a battery. Thus, in situations where IC 550 is coupled to a battery charger that charges a battery (e.g., in a mobile telephone or other device, such as a portable device) or includes a battery charger, the temperature value may be used as a proxy for the battery temperature. Charging parameters, such as current, voltage, or charge duration or type (float, etc.), may be adjusted or varied, as desired.

Figure 11:
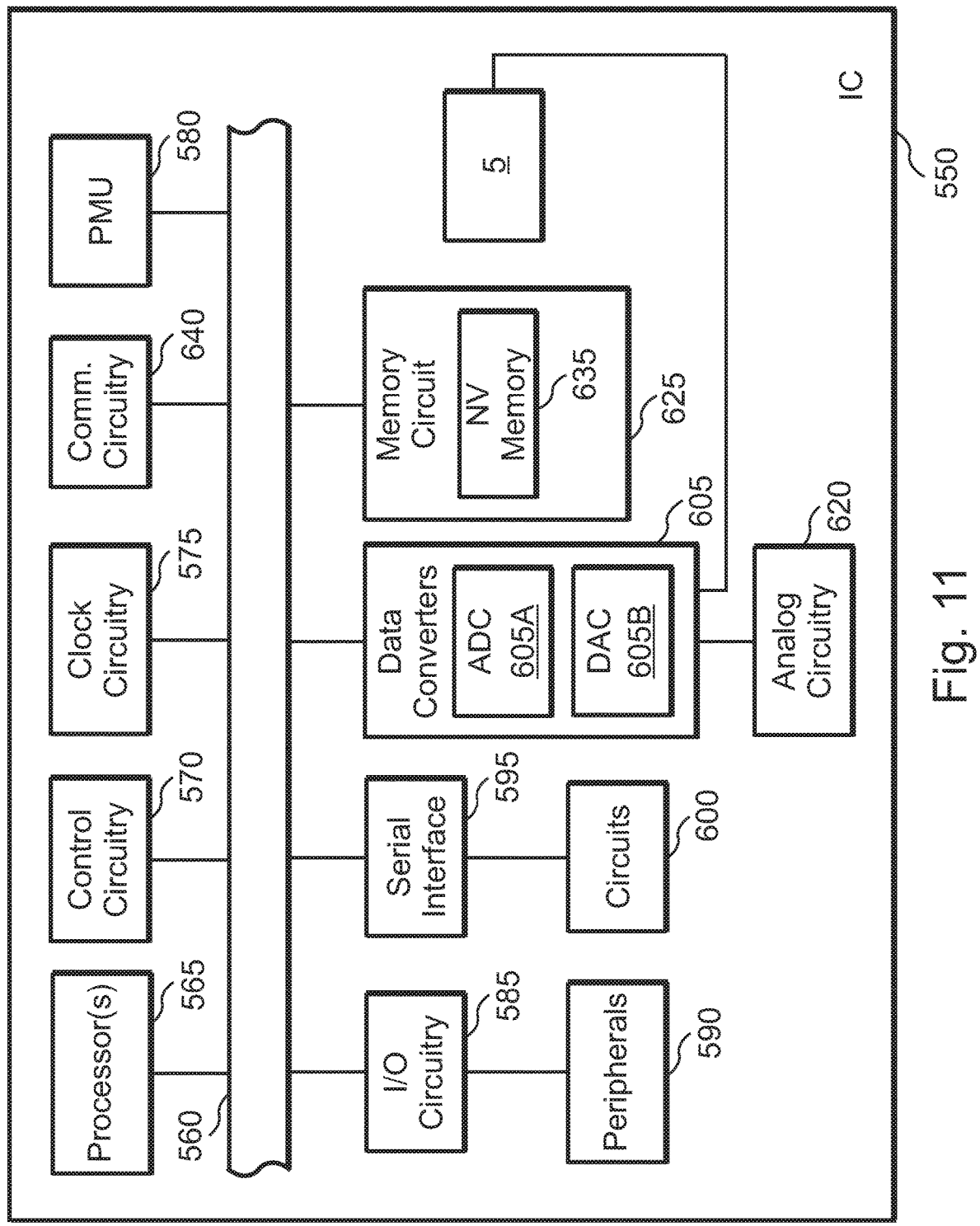
FIG. 11 shows a circuit arrangement for temperature sensing/measurement in an IC according to another exemplary embodiment.

FIG. 11 shows a circuit arrangement for temperature sensing/measurement in IC 550 according to another exemplary embodiment. In the embodiment shown, temperature measurement circuitry 5 is coupled to data converter(s) 605. The data converter circuitry in data converter(s) 605 may be used to change the format (analog versus digital) of the output signal of temperature measurement circuitry 5 and to provide the results to one or more blocks in IC 550, including analog circuitry 620.

Figure 12:
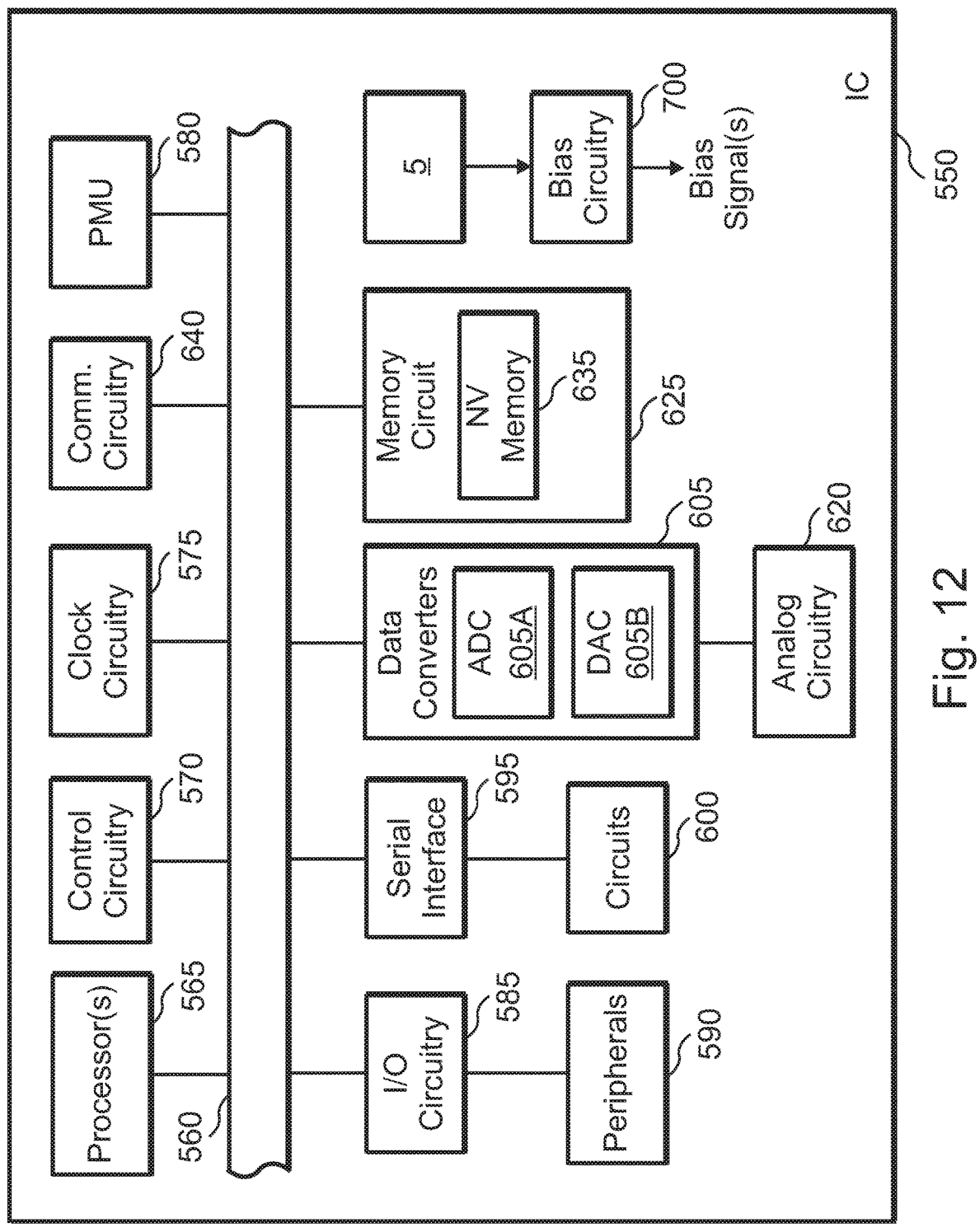
FIG. 12 shows a circuit arrangement for temperature sensing/measurement in an IC according to another exemplary embodiment.

FIG. 12 shows a circuit arrangement for temperature sensing/measurement in IC 550 according to another exemplary embodiment. In the embodiment shown, temperature measurement circuitry 5 is coupled to bias circuitry 700. Temperature measurement circuitry 5 provides the temperature of IC 550 (or the temperature of a desired component, block, circuit, or device in IC 550) to bias circuitry 700.

Based on the temperature provided by temperature measurement circuitry 5, bias circuitry 700 may change or vary the magnitude of one or more bias signals (e.g., bias current(s), bias voltage(s)) that it provides to one or more blocks in IC 550. As an example, by using the temperature value, bias circuitry 700 can provide bias signal(s) with no dependence (or nearly no dependence in a practical implementation) on temperature. As another example, conversely, bias circuitry 700 may change the values of the bias signal(s) based on the temperature value. As a result, the bias signal(s) may have a desired temperature dependence.

Figure 13:
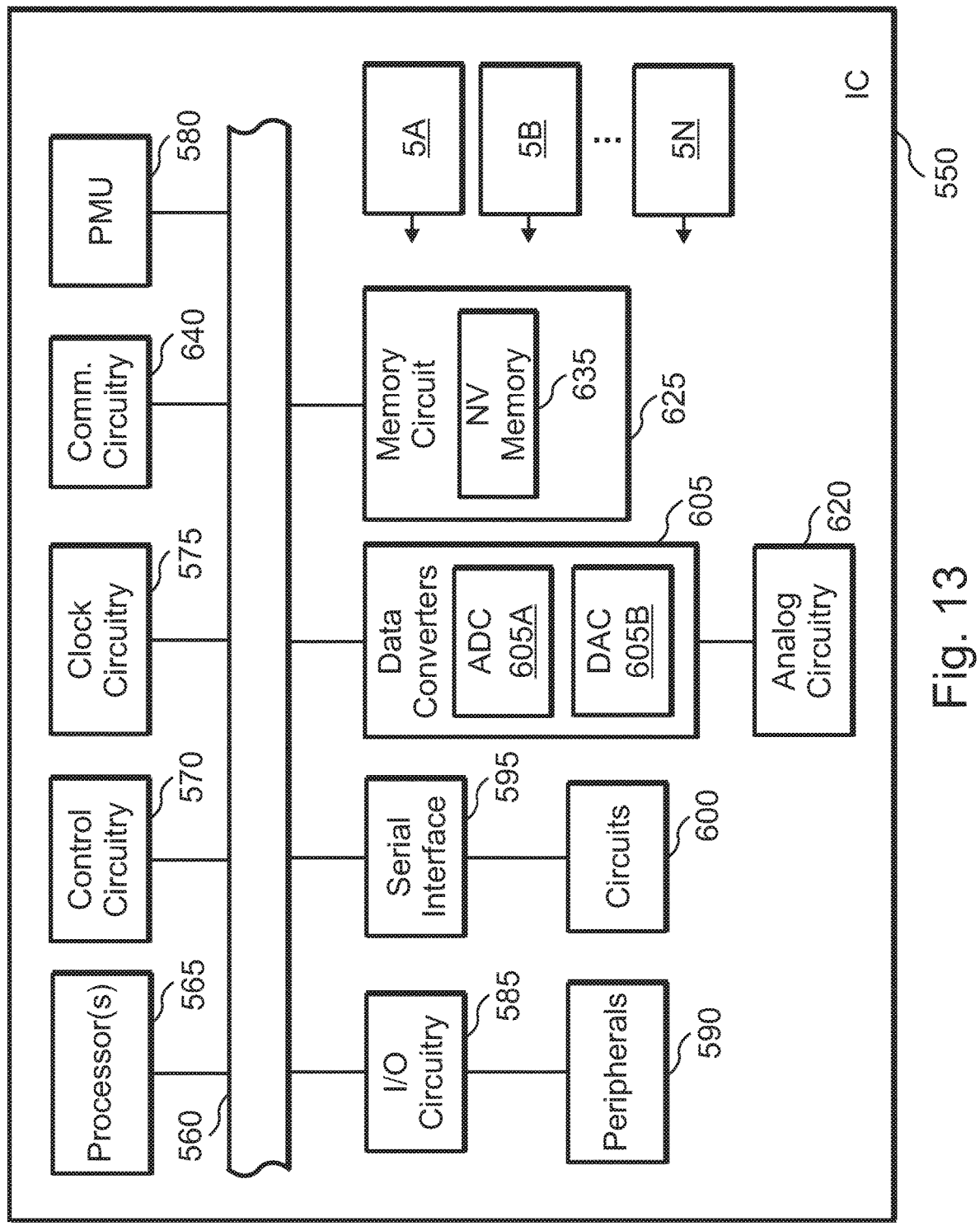
FIG. 13 shows a circuit arrangement for temperature sensing/measurement in an IC according to another exemplary embodiment.

FIG. 13 shows a circuit arrangement for temperature sensing/measurement in IC 550 according to another exemplary embodiment. In this embodiment, a set of N temperature measurement circuitry 5 are used. The set of temperature measurement circuitry 5 may be placed in various locations in IC 550. For example, each of temperature measurement circuitry 5 in the set may be placed in relatively close proximity to a block, device, circuit, etc. whose temperature value is to be measured. The set of temperature measurement circuitry 5 in the set may provide their output temperature values to one or more blocks in IC 550 (e.g., control circuitry 570, clock circuitry 575, etc., as described above).

As another example, temperature measurement circuitry 5 in the set may be placed in a geometric arrangement across IC 550. For instance, temperature measurement circuitry 5 in the set may be positioned in a grid across IC 550, or in various quadrants of IC 550, etc. By using the output temperature values of temperature measurement circuitry 5 in the set the temperatures at the locations corresponding to the positions of temperature measurement circuitry 5 may be determined. The temperature values may be used in various ways (e.g., provided to control circuitry 570, clock circuitry 575, etc., as described above), as desired. Based on the temperature values, various actions may be taken, such as controlling one or more blocks in IC 550, controlling clock signal(s), etc., as desired, and as persons of ordinary skill in the art will understand.

Note that in the embodiment shown in FIG. 13, the set of temperature measurement circuitry 5 may each use its own controller 10 (see FIG. 10), as desired. In some embodiments, the functionality and/or circuitry of such controllers may be combined in one or more controllers 10, which are used to control temperature measurement circuitry 5, as desired. For example, in some embodiments, one controller 10 may be used in a time-multiplexed manner to control the temperature measurement circuitry 5 in the set, as desired.

Various circuits and blocks described above and used in exemplary embodiments may be implemented in a variety of ways and using a variety of circuit elements or blocks. For example, controller 10, counters 50A-50D, clock circuit 60, or various blocks in IC 550 may generally be implemented using digital circuitry. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. In addition, analog circuitry or mixed-signal circuitry or both may be included, for instance, power converters, discrete devices (transistors, capacitors, resistors, inductors, diodes, etc.), and the like, as desired. The analog circuitry may include bias circuits, decoupling circuits, coupling circuits, supply circuits, current mirrors, current and/or voltage sources, filters, amplifiers, converters, signal processing circuits (e.g., multipliers), detectors, transducers, discrete components (transistors, diodes, resistors, capacitors, inductors), analog MUXs and the like, as desired, and as persons of ordinary skill in the art will understand. The mixed-signal circuitry may include analog to digital converters (ADCs), digital to analog converters (DACs), etc., in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology, target markets, target end-users, etc.

Various circuits and blocks described above and used in exemplary embodiments may be implemented in a variety of ways and using a variety of circuit elements or blocks. For example, various amplifiers, comparators, ramp voltage generator, $V_H$ and $V_L$ voltage generator, etc., may generally be implemented using analog circuitry. The analog circuitry may include bias circuits, decoupling circuits, coupling circuits, supply circuits, current mirrors, current and/or voltage sources, filters, amplifiers, converters, signal processing circuits (e.g., multipliers), sensors or detectors, transducers, discrete components (transistors, diodes, resistors, capacitors, inductors), analog MUXs, and the like, as desired, and as persons of ordinary skill in the art will understand. In addition, digital circuitry or mixed-signal circuitry or both may be included. The digital circuitry may include circuit elements or blocks such as gates, digital multiplexers (MUXs), latches, flip-flops, registers, finite state machines (FSMs), processors, programmable logic (e.g., field programmable gate arrays (FPGAs) or other types of programmable logic), arithmetic-logic units (ALUs), standard cells, custom cells, etc., as desired, and as persons of ordinary skill in the art will understand. The mixed-signal circuitry may include analog to digital converters (ADCs), digital to analog converters (DACs), etc., in addition to analog circuitry and digital circuitry, as described above, and as persons of ordinary skill in the art will understand. The choice of circuitry for a given implementation depends on a variety of factors, as persons of ordinary skill in the art will understand. Such factors include design specifications, performance specifications, cost, IC or device area, available technology, such as semiconductor fabrication technology, target markets, target end-users, etc.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
a temperature measurement circuit, comprising:
   a bandgap circuit including an amplifier having an offset voltage that is compensated by using a set of trimming bits, the bandgap circuit providing first and second voltages related to a temperature to be measured; and
   a measuring circuit coupled to receive the first and second voltages, the measuring circuit including a comparator coupled to receive the first and second voltages and to derive a temperature measurement from the first and second voltages.

2. The apparatus according to claim 1, wherein the comparator is coupled to receive a set of voltages at a first input, wherein the set of voltages comprises the first and second voltages.

3. The apparatus according to claim 2, wherein the set of voltages further comprises third and fourth voltages, wherein the third and fourth voltages have fixed values.

4. The apparatus according to claim 3, further comprising a multiplexer (MUX) coupled to provide the set of voltages to the first input of the comparator.

5. The apparatus according to claim 2, further comprising a ramp generator circuit to provide a ramp voltage to a second input of the comparator.

6. The apparatus according to claim 5, further comprising at least one counter coupled to a clock source, the at least one counter providing a set of count values depending on an output signal of the comparator.

7. The apparatus according to claim 6, wherein the set of count values includes first and second count values corresponding to the first and second voltages.

8. The apparatus according to claim 7, wherein the temperature measurement is derived from the first and second count values.

9. The apparatus according to claim 7, wherein the set of count values includes third and fourth count values corresponding to fixed voltages.

10. A method of measuring a temperature, the method comprising:
   compensating an offset voltage of an amplifier by using a set of trimming bits;
   generating first and second voltages related to the temperature, by using a bandgap circuit; and
   using the first and second voltages to derive the temperature by generating count values corresponding to the first and second voltages.

11. The method according to claim 10, wherein compensating the offset voltage of the amplifier by using the set of trimming bits is performed in a first mode of operation of the bandgap circuit.

12. The method according to claim 11, wherein generating first and second voltages related to the temperature, by using the bandgap circuit, is performed in a second mode of operation of the bandgap circuit.

13. The method according to claim 10, wherein generating count values further comprises generating count values corresponding to first and second fixed voltages, and wherein the temperature is derived by using the count values corresponding to the first and second voltages and the count values corresponding to the first and second fixed voltages.

14. The method according to claim 13, wherein the count values are generated by counting cycles of a clock signal.

15. The method according to claim 13, wherein generating count values further comprises comparing the first and second voltages and the first and second fixed voltages with a ramp voltage.

16. The method according to claim 15, comparing the first and second voltages and the first and second fixed voltages with the ramp voltage comprises using a comparator to perform the comparing.

17. The method according to claim 16, wherein comparing the first and second voltages and the first and second fixed voltages with the ramp voltage comprises using a multiplexer (MUX) to selectively provide the first and second voltages and the first and second fixed voltages to the comparator.

18. The method according to claim 17, wherein using the MUX to selectively provide the first and second voltages and the first and second fixed voltages to the comparator comprises using a controller to control select signals of the MUX.

19. The method according to claim 18, wherein using the controller to control select signals of the MUX comprises using an output signal of the comparator.

20. The method according to claim 13, wherein using the count values corresponding to the first and second voltages and the count values corresponding to the first and second fixed voltages comprises using a set of counters to count cycles of a clock signal in response to corresponding enable signals.

* * * * *